(12) United States Patent
Hatano et al.

(10) Patent No.: US 6,580,105 B1
(45) Date of Patent: Jun. 17, 2003

(54) SOLID-STATE IMAGING DEVICE

(75) Inventors: Keisuke Hatano, Tokyo (JP); Shinichi Horiba, Tokyo (JP)

(73) Assignee: NEC Electronic Corporation, Kanagawa (JP)

( * ) Notice: Subject to any disclaimer, the term of this patent is extended or adjusted under 35 U.S.C. 154(b) by 0 days.

(21) Appl. No.: 09/470,217

(22) Filed: Dec. 22, 1999

(30) Foreign Application Priority Data

Dec. 24, 1998 (JP) ............................................. 10-366904

(51) Int. Cl.$^7$ ...................... H01L 27/148; H01L 29/768
(52) U.S. Cl. ........................ 257/222; 257/233; 257/249; 257/413
(58) Field of Search ................................. 257/222, 223, 257/249, 250, 232, 233

(56) References Cited

U.S. PATENT DOCUMENTS

| | | | | |
|---|---|---|---|---|
| 4,055,885 A | * | 11/1977 | Takemoto | ................... 257/250 |
| 4,725,872 A | * | 2/1988 | Beuke et al. | ................ 257/249 |
| 5,210,433 A | * | 5/1993 | Ohsawa et al. | ............. 257/250 |
| 5,428,231 A | * | 6/1995 | Tanaka et al. | ............... 257/232 |
| 6,194,749 B1 | * | 2/2001 | Ogawa | ........................ 257/249 |

FOREIGN PATENT DOCUMENTS

| | | |
|---|---|---|
| JP | 5-267638 | 10/1993 |
| JP | 7-321300 | 12/1995 |
| JP | 2571011 | 10/1996 |

* cited by examiner

*Primary Examiner*—Gene M. Munson
(74) *Attorney, Agent, or Firm*—Dickstein, Shapiro, Morin & Oshinsky LLP

(57) ABSTRACT

In a solid-state imaging device, an insulation film is used to fill a separating region that divides a charge transfer electrode in the row direction, thereby achieving flattening, after which an interlayer insulation film and a metal light-shielding film are formed.

3 Claims, 12 Drawing Sheets

Fig. 1
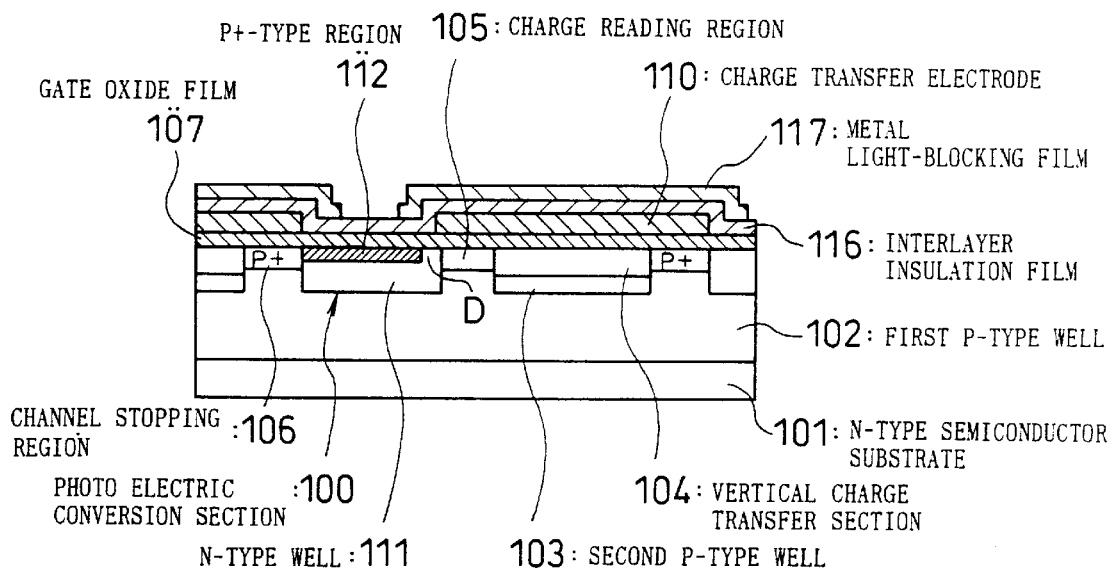
(a)
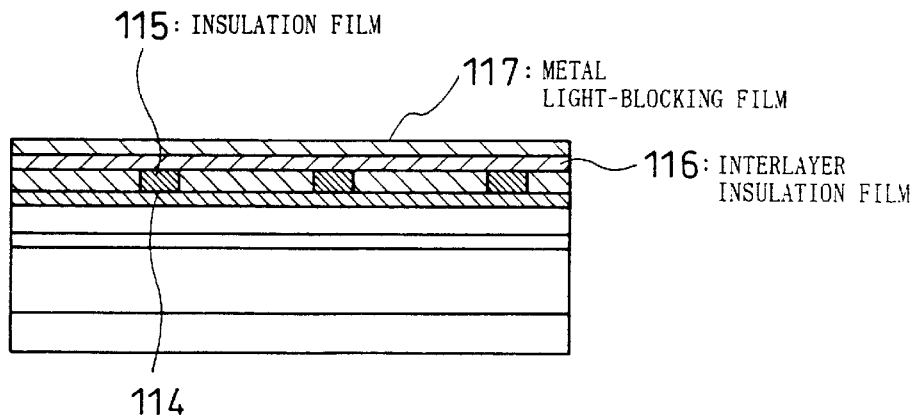
(b)

Fig. 4
(a)
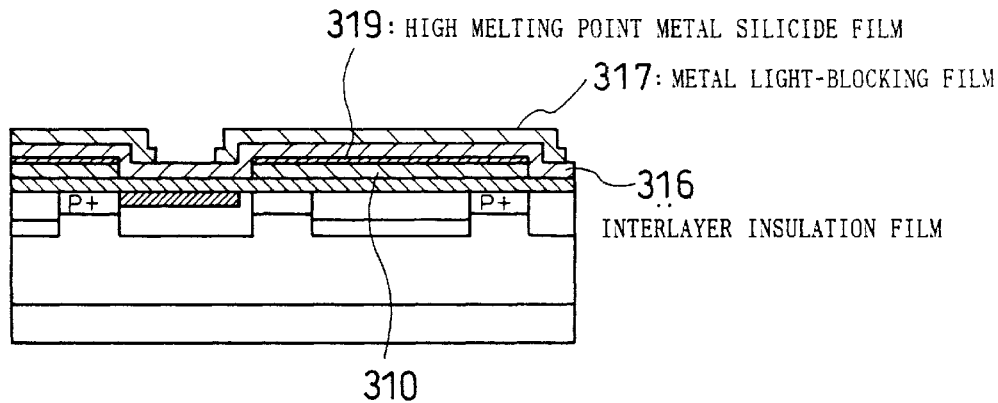
(b)
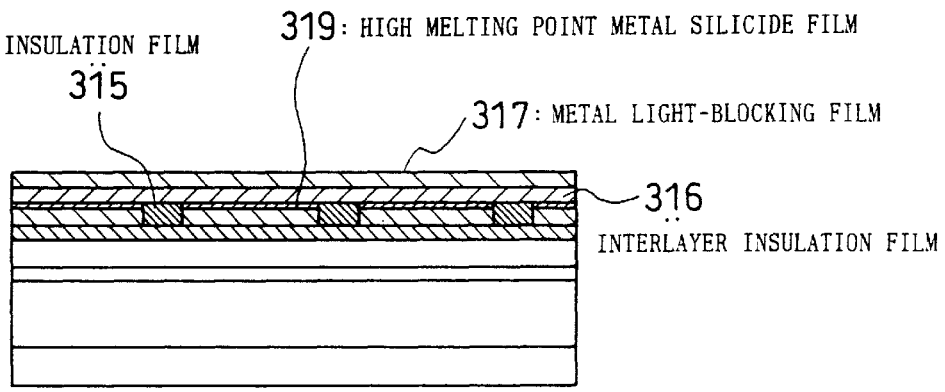

Fig. 8
PRIOR ART
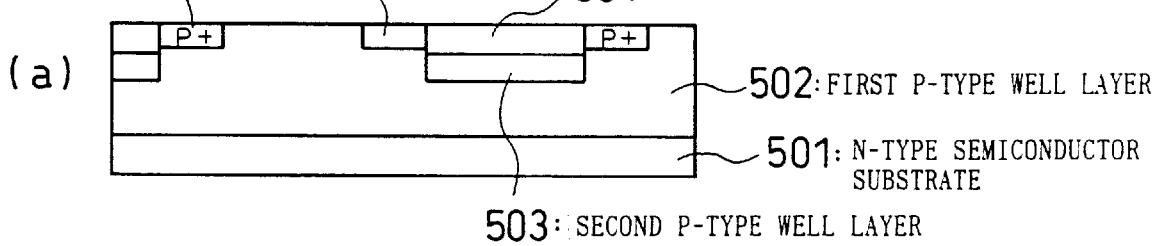
(a)
- 506: CHANNEL STOPPING REGION
- 505: CHARGE READOUT REGION
- 504: VERTICAL CHARGE TRANSFER SECTION
- 502: FIRST P-TYPE WELL LAYER
- 501: N-TYPE SEMICONDUCTOR SUBSTRATE
- 503: SECOND P-TYPE WELL LAYER
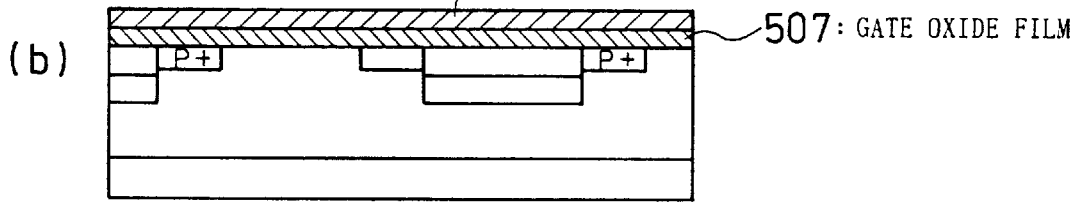
(b)
- 508: CHARGE TRANSFER ELECTRODE MATERIAL FILM
- 507: GATE OXIDE FILM
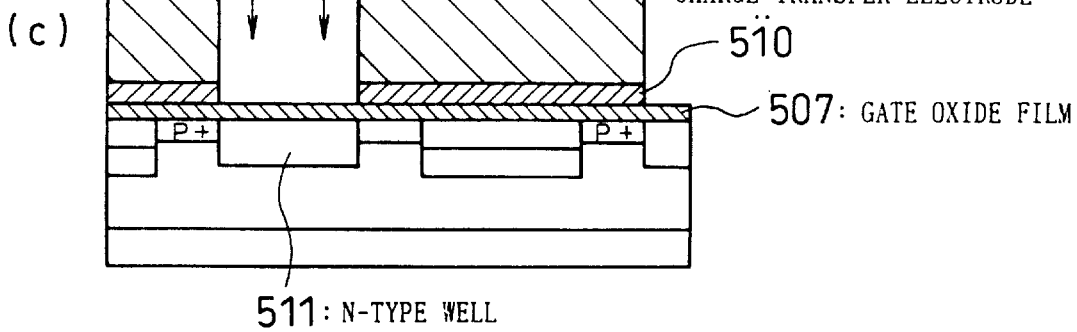
(c)
- 509: PHOTORESIST
- CHARGE TRANSFER ELECTRODE 510
- 507: GATE OXIDE FILM
- 511: N-TYPE WELL

Fig. 9
PRIOR ART
(a)
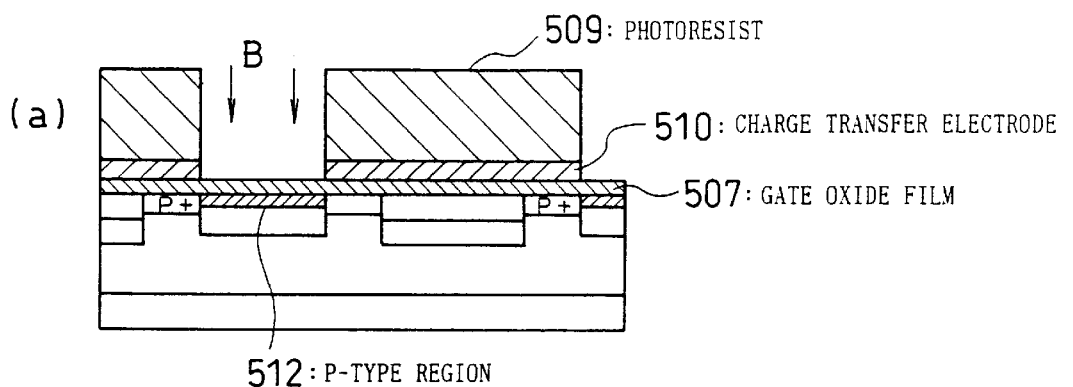
- 509: PHOTORESIST
- 510: CHARGE TRANSFER ELECTRODE
- 507: GATE OXIDE FILM
- 512: P-TYPE REGION
(b)
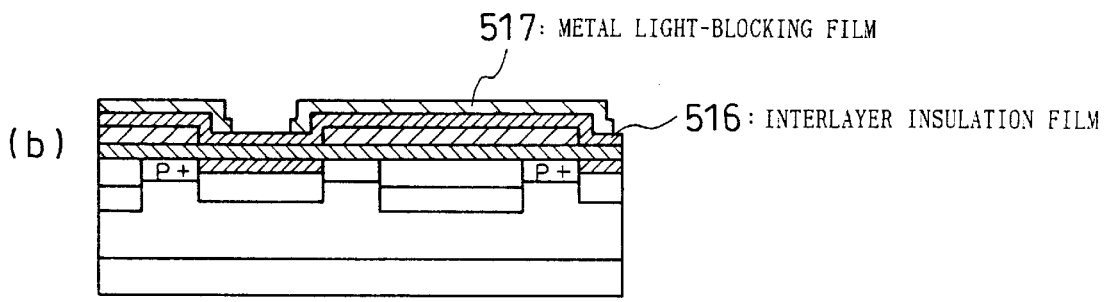
- 517: METAL LIGHT-BLOCKING FILM
- 516: INTERLAYER INSULATION FILM

US 6,580,105 B1

SOLID-STATE IMAGING DEVICE

BACKGROUND OF THE INVENTION

1. Field of the Invention

The present invention relates to a solid-state imaging device and a method for manufacturing a solid-state imaging device, and more particularly it relates to a solid-state imaging device in which a single-layer electrically conductive electrode film is processed so as to form a charge transfer electrode, wherein a narrow interelectrode gap is flattened, with improved step coverage in a metal interconnect or metal light-shielding film formed thereon.

2. Background of the Invention

FIG. 8 and FIG. 9 of the accompanying drawings show a sequence of cross-section views illustrating the processes in manufacturing a solid-state imaging device that uses a conventional buried type photodiode as an photoelectric conversion section (refer to Japanese Unexamined Patent Publication (KOKAI) No.5-267638).

In the above-noted process, thermal diffusion is first used to form a first p-type well layer 502 and a second p-type well 503 onto an n-type semiconductor substrate 501, after which ion implantation of phosphorus is done to form a vertical charge transfer section 504. Boron is then ion implanted to form a channel stopping region 506 and a charge reading region 505 (FIG. 8(a)).

Next, the surface of the n-type semiconductor substrate is thermally oxidized to form a gate electrode film 507, after which, as shown in FIG. 8(b), low-pressure CVD is used to form a charge transfer electrode material film 508 on the gate electrode 507. Patterning is then done for forming the reading electrode.

Then, photoresist 509 is used as a mask in performing dry etching so as to form a charge transfer electrode 510. Next, the charge transfer electrode with the photoresist remaining is used as a mask in performing self-aligning ion implantation of phosphor, so as to form the n-type well 511 that will serve as the photodiode. When this is done, the film thickness of the photoresist 509 is made approximately 3 μm, so that the phosphorus ions do not penetrate (FIG. 8(c)).

Then, to form the buried type photodiode, the photoresist 509 is removed, after which boron is ion implanted with the charge transfer electrode 510 used as a mask, thereby forming a p+ type region 512.

While FIG. 8 and FIG. 9 show a cross-section view of a pixel in the processes of manufacturing a solid-state imaging device, the plan view of pattern arrangement is, for example, as shown in FIG. 10.

In FIG. 10, a the charge transfer electrode is made by processing a single-layer charge transfer electrode material, a photoelectric conversion section being formed as a region enclosed within the charge transfer electrode. The cross-section views of FIG. 8 and FIG. 9 are as seen along the cutting line A–A' in FIG. 10.

Four charge transfer electrodes taken as a unit, with a pulses of different phases ((Φ1 to Φ4) applied to each, and in order to perform charge transfer using these pulses, it is necessary to provide a region 614 that separates the charge transfer electrodes in the row direction.

FIG. 11 is a cross-section view along the cutting line B–B' shown in FIG. 10. A region 714 is formed which separates the charge transfer electrodes in the row direction, a metal light-shielding film 717 being formed thereon, with an intervening interlayer insulation film 716 therebetween, thereby preventing light from striking the vertical charge transfer section.

In the above-noted solid-state imaging device of the past, however, as shown in FIG. 12, because the region (interelectrode gap) that separates the charge transfer electrodes in the row direction is formed with a short distance of approximately 0.25 μm to 0.50 μm, porosity develops in the interlayer insulation film 816 formed thereover or locations of poor coverage occur, so that breaks 820 occur in the metal light-shielding film or metal interconnect formed thereover, thereby causing the problem of deterioration in either the light-blocking characteristics or the charge transfer characteristics.

One method that can be envisioned to prevent interconnect breakage is that of flattening the entire surface before providing the interconnects. When this is done, however, because the photoelectric conversion section as shown in FIG. 13 is also flattened, there is an increase in the height of the metal light-shielding film from the surface of the substrate, so that angularly incident light 921 enters the charge transfer region, leading to a deterioration in smear characteristics.

Accordingly, it is an object of the present invention to solve the above-noted problem in a convetional solid-state imaging device, by providing a solid-state imaging device wherein a charge transfer electrode is formed by etching a single-layer charge-transfer material film, this etching region being divided into a first region to be divided in the row direction and a second region on a photoelectric conversion section, the etching region of the first region being filled with an insulation film, so as to flatten only the top part of the vertical charge transfer section or the bottom part of a region formed of a metal wiring for applying a drive voltage to a charge transfer electrode, thereby achieving a solid-state imaging device with good formation of metal wirings, without a deterioration of the smear characteristics.

SUMMARY OF THE INVENTION

In order to achieve the above-noted object, the present invention has the following basic technical constitution.

Specifically, the first aspect of the present invention is a solid-state imaging device comprising: a photoelectric conversion section formed within a surface region of semiconductor layer of a first conductivity type; a charge transfer section of a second conductivity type formed adjacent to the photoelectric conversion section within the surface region of the semiconductor layer of the first conductivity type, which receives and transfers a signal charge generated by the photoelectric conversion section; a read-out section formed in the surface region of the semiconductor layer of the first conductivity type for reading the signal generated by said photoelectric conversion section to the charge transfer section; and a single-layer charge transfer electrode formed over the read-out section and the charge transfer section, with an intervening gate insulation film therebetween, a region that separates the charge transfer electrode is filled with an insulation film having a height that is equivalent to or less than that of the charge transfer electrode.

In the second aspect of the present invention, a silicide film is formed on the surface of the charge transfer electrode.

The first aspect of a method of the present invention is a method for manufacturing a solid-state imaging device, the solid-state imaging device comprising: a photoelectric conversion section formed within a surface region of semiconductor layer of a first conductivity type; a charge transfer section of a second conductivity type formed adjacent to the photoelectric conversion section within the surface region of the semiconductor layer of the first conductivity type, which receives and transfers a signal charge generated by the photoelectric conversion section; a read-out section formed in the surface region of the semiconductor layer of the first conductivity type for reading the signal generated by the photoelectric conversion section to the charge transfer section; and a single-layer charge transfer electrode formed over the read-out section and the charge transfer section, with an intervening gate insulation film therebetween, an insulation film separating mutually adjacent the charge transfer electrodes; and a light-shielding film provided on the insulation film, the method comprising: a first step of etching of a first region on an electrically conductive electrode material film on the gate insulation film so as to divide the electrically conductive electrode material film and form the charge transfer electrodes; a second step of forming an insulation film over an entire surface and filling the first region with the insulation film; a third step of removing said insulation film until at least the electrically conductive electrode material film is exposed; and a forth step of etching a second region on the electrically conductive electrode material film so as to form an aperture in the photoelectric conversion region.

In a second aspect of the method according to the present invention, the photoelectric conversion section is formed in a self-aligned manner with respect to the second region.

In a third aspect of the method according to the present invention, the fourth step includes a process of siliciding a surface of the electrically conductive electrode material film.

In a forth aspect of the method according to the present invention, the third step further includes processes of forming a high melting point metal film over an entire surface, after removing the insulation film until the electrically conductive electrode material film is exposed, and siliciding a surface of the electrically conductive electrode material film by thermal treatment, and removing the high melting point metal film that is not silicided.

In a fifth aspect of the method according to the present invention, the fourth step includes a processes of etching the electrically conductive electrode material film using a mask, and ion implantation of a first conductivity dopant and a second conductivity dopant, using the mask and the electrically conductive electrode material film or the electrically conductive electrode material film as a mask, so as to form the photoelectric conversion section.

In a sixth aspect of the method according to the present invention, the fourth step further includes a processes of etching said electrically conductive electrode material film using a mask, and ion implantation of a second conductivity dopant, using the mask and the electrically conductive electrode material film or the electrically conductive electrode material film as a mask, and ion implantation of a first conductivity dopant, within a surface of the second conductivity region, using the charge transfer electrode as a mask, in a self-aligning manner.

In a seventh aspect of the method according to the present invention, the forth step further includes a process of controlling an angle of incidence of ion implantation of the second conductivity dopant, so as to form a second conductivity region that encroaches under the charge transfer electrode, thereby forming the second conductivity region in a self-aligning manner.

In a eighth aspect of the method according to the present invention, the forth step further includes a process of controlling an angle of incidence of ion implantation of a first conductivity dopant, so as to form a first conductivity type semiconductor layer in a self-aligning manner and at a prescribed distance from an edge of the charge transfer electrode.

A nineth aspect of the method according to the present invention is, a method for manufacturing a solid-state imaging device, the solid-state imaging device comprising: a photoelectric conversion section formed within a surface region of semiconductor layer of a first conductivity type; a charge transfer section of a second conductivity type formed adjacent to the photoelectric conversion section within the surface region of the semiconductor layer of the first conductivity type, which receives and transfers a signal charge generated by the photoelectric conversion section; a read-out section formed in the surface region of the semiconductor layer of the first conductivity type for reading the signal generated by said photoelectric conversion section to the charge transfer section; and a single-layer charge transfer electrode formed over the read-out section and the charge transfer section, with an intervening gate insulation film therebetween, an insulation film separating mutually adjacent the charge transfer electrodes; and a light-shielding film provided on the insulation film, the method comprising: a first step of forming an electrically conductive electrode material film on the semiconductor layer of the first conductivity type, with the intervening gate electrode therebetween; a second step of forming a first mask on the electrically conductive electrode material film; a third step of etching a first region of the electrically conductive electrode material film, using the first mask, and dividing the electrically conductive electrode material film in a row direction; a fourth step of forming an insulation film over the entire surface; a fifth step of performing thermal flow of the insulation film; a sixth step of etching the insulation film so as to expose a surface of the electrically conductive electrode material film; a seventh step of forming a second mask over an entire surface; and an eighth step of etching a second region on the electrically conductive electrode material film, using the second mask, so as to form an aperture in the photoelectric conversion section.

BRIEF DESCRIPTION OF THE DRAWINGS

FIG. 1(*a*) and FIG. 1(*b*) are cross-section views of the first embodiment of a solid-state imaging device according to the present invention.

FIG. 2(*b*) is a cross-section view showing processes subsequent to those shown in FIG. 2(*a*).

FIG. 2(*c*) is a cross-section view showing processes subsequent to those shown in FIG. 2(*b*).

FIG. 2(*d*) is a cross-section view showing processes subsequent to those shown in FIG. 2(*c*).

FIG. 2(*e*) is a cross-section view showing processes subsequent to those shown in FIG. 2(*d*).

FIG. 3(*b*) is a cross-section view showing processes subsequent to those shown in FIG. 3(*a*).

FIG. 3(*c*) is a cross-section view showing processes subsequent to those shown in FIG. 3(*b*).

FIG. 3(*d*) is a cross-section view showing processes subsequent to those shown in FIG. 3(*c*).

FIG. 3(*e*) is a cross-section view showing processes subsequent to those shown in FIG. 3(*d*).

FIG. 4(a) and FIG. 4(b) are cross-section views showing the second embodiment of a solid-state imaging device according to the present invention.

FIG. 8(a) is a cross-section views showing the manufacturing processes for a solid-state imaging device according to the prior art.

FIG. 8(b) is a cross-section view showing processes subsequent to those shown in FIG. 8(a).

FIG. 8(c) is a cross-section view showing processes subsequent to those shown in FIG. 8(b).

FIG. 9(a) is a cross-section view showing processes subsequent to those shown in FIG. 8(c).

FIG. 9(b) is a cross-section view showing processes subsequent to those shown in FIG. 9(a).

DESCRIPTION OF THE PREFERRED EMBODIMENTS

Preferred embodiments of a solid-state imaging device and a method for manufacturing a solid-state imaging device according to the present invention are described in detail below, with references being made to relevant accompanying drawings.

Figure 2:
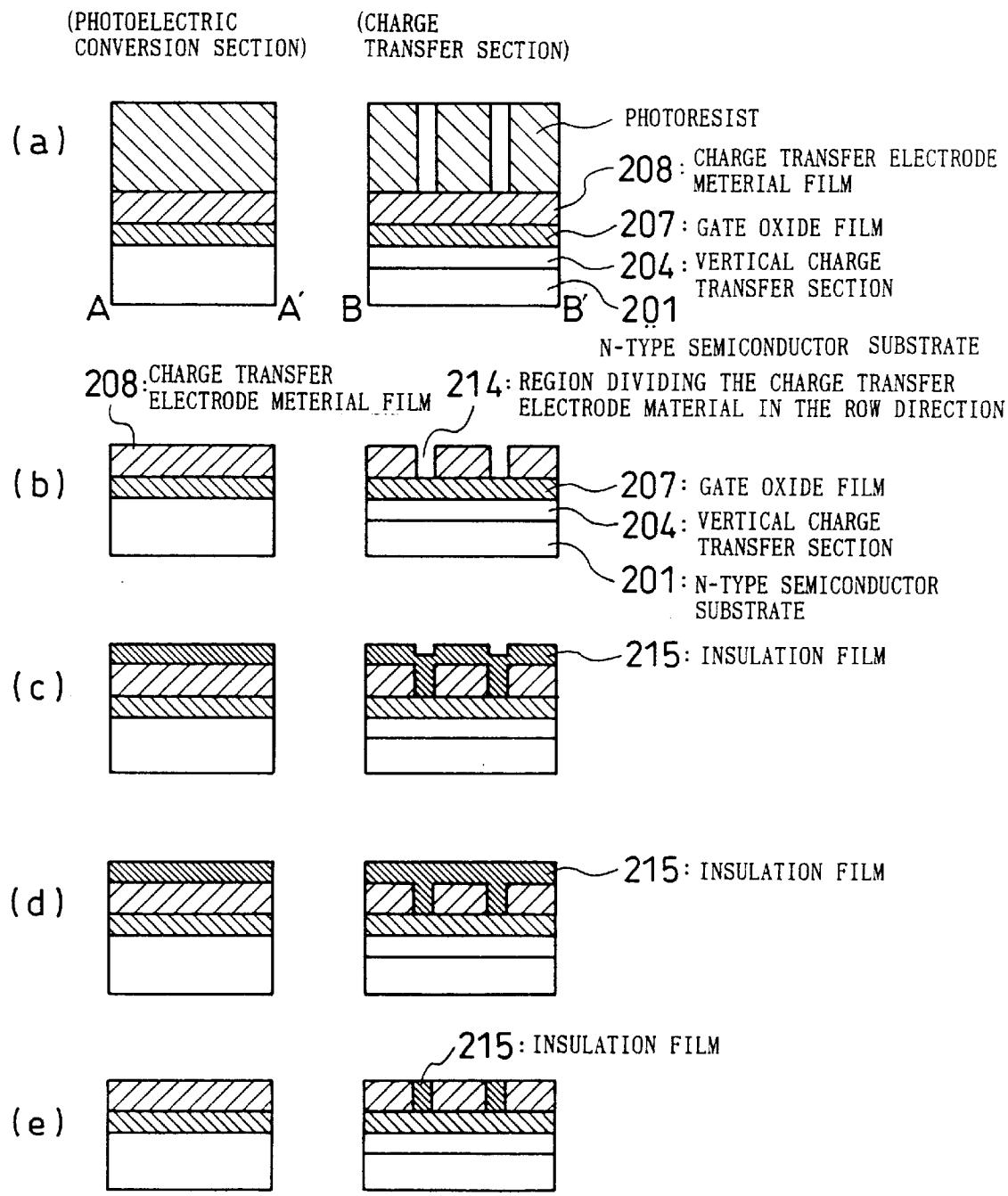
FIG. 2(*a*) is a cross-section view showing the processes for manufacturing the first embodiment of a solid-state imaging device according to the present invention.
Figure 3:
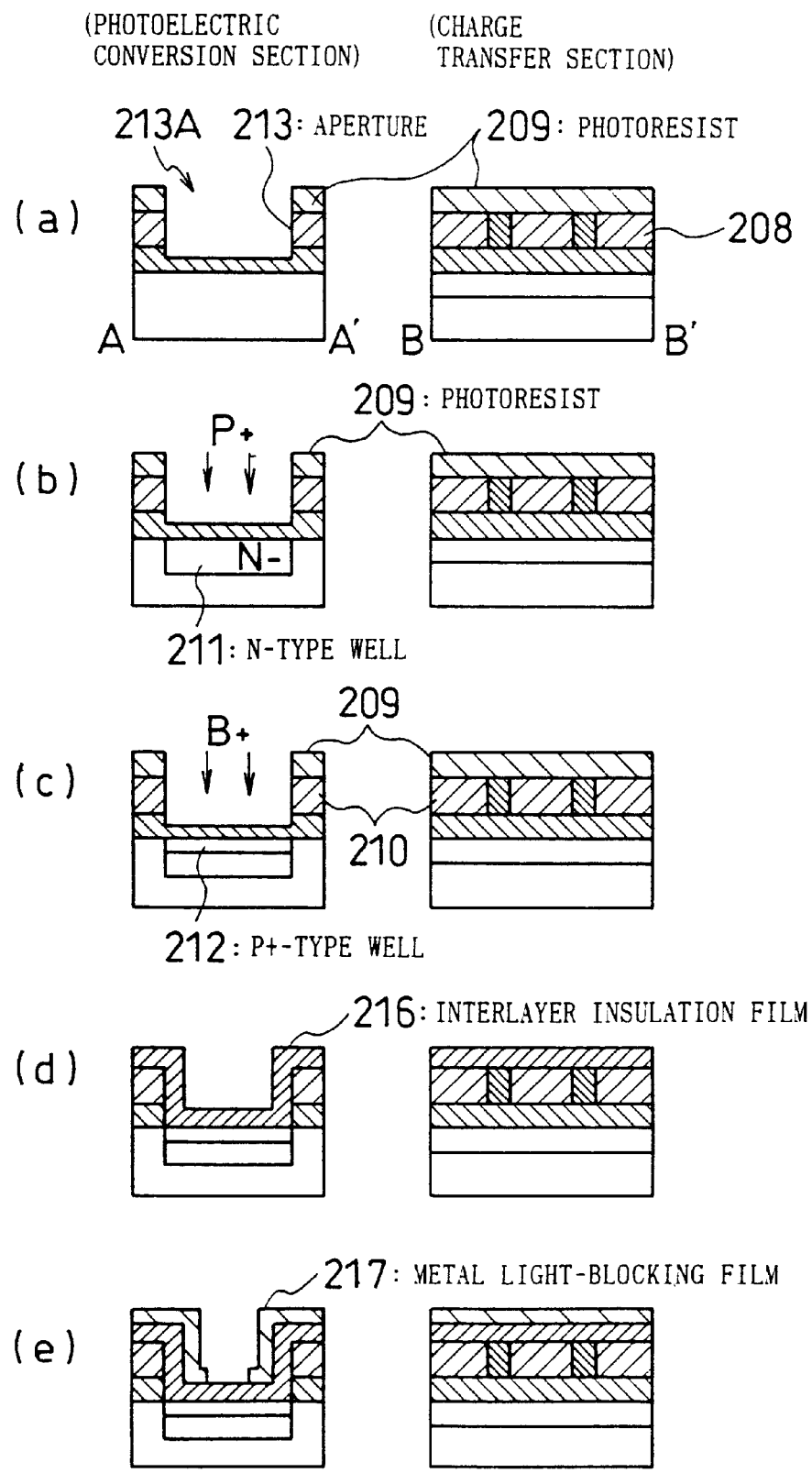
FIG. 3(*a*) is a cross-section view showing processes subsequent to those shown in FIG. 2(*e*).

FIG. 1 to FIG. 3 show the first embodiment of a solid-state imaging device and method for manufacturing this solid-state imaging device according to the present invention. These drawings show a method for manufacturing a solid-state imaging device having a photoelectric conversion section 100 formed within a surface region of semiconductor layer of a first conductivity type; a charge transfer section 104 of a second conductivity type formed adjacent to the photoelectric conversion section 100 within the surface region of the semiconductor layer of the first conductivity type, which receives and transfers a signal charge generated by the photoelectric conversion section 100; a read-out section 105 formed in the surface region of the semiconductor layer of the first conductivity type for reading the signal generated by the photoelectric conversion section 100 to the charge transfer section 104; and a single-layer charge transfer electrode 110 formed over the read-out section 105 and the charge transfer section 104, with an intervening gate insulation film 107 therebetween, an insulation film 115 separating mutually adjacent the charge transfer electrodes 110; and a light-shielding film 117 provided on the insulation film 115, the method comprising: a first step of etching of a first region on an electrically conductive electrode material film 208 on the gate insulation film 107 so as to divide the electrically conductive electrode material film 208 and form the charge transfer electrodes 110; a second step of forming an insulation film 215 over an entire surface and filling the first region with the insulation film 215; a third step of removing said insulation film 215 until at least the electrically conductive electrode material film 208 is exposed; and a forth step of etching a second region on the electrically conductive electrode material film 208 so as to form an aperture 213 in the photoelectric conversion region.

The photoelectric conversion section 100 is formed in a self-aligned manner with respect to the second region.

The fourth step includes a process of siliciding a surface of the electrically conductive electrode material film 208.

The fourth step further includes a processes of etching the electrically conductive electrode material film 208 using a mask 209, and ion implantation of a first conductivity dopant and a second conductivity dopant, using the mask 209 and the electrically conductive electrode material film 208 or the electrically conductive electrode material film 208 as a mask, so as to form the photoelectric conversion section 100.

The fourth step further includes a processes of etching said electrically conductive electrode material film 208 using a mask, and ion implantation of a second conductivity dopant, using the mask 209 and the electrically conductive electrode material film 208 or the electrically conductive electrode material film 208 as a mask, and ion implantation of a first conductivity dopant, within a surface of the second conductivity region 211, using the charge transfer electrode 110 as a mask, in a self-aligning manner.

The first embodiment of the present invention is described in further detail below.

FIG. 1 is a cross-section view of a solid-state imaging device of the first embodiment that uses a buried type photodiode as a photoelectric conversion section. Because the plan view pattern is the same as a device of the prior art, it is not shown. FIG. 1(a) is a cross-section view of the photoelectric conversion section (corresponding to the A–A' cross-section view of FIG. 10), and FIG. 1(b) is a cross-section view along the transfer direction of the vertical charge transfer section (corresponding to the B–B' cross-section view of FIG. 10).

In this embodiment, the charge transfer electrode is made of single layer of polysilicon, the groove-shaped region separating the charge transfer electrode in the row direction being filled by an insulation film 115 and flattened, after which an interlayer insulation film 116 and metal light-shielding film 117 are formed.

In the present invention, etching process is divided into two steps. The first step is an etching of the regions 214 that separate the charge transfer electrode in the row direction, and the second step is an etching of the regions 213A on the photoelectric conversion section. After the region 213A on the photoelectric conversion section is etched, ion implantation of phosphor is done so as to form an n-type well that will serve as the photoelectric conversion section, thereby forming the charge reading electrode 105 and the photoelectric conversion section 100 in self-aligning manner.

Next, the method for manufacturing a solid-state imaging device as shown in FIG. 1 will be described, making reference to cross-section views of the photoelectric conversion section along the transfer direction and cross-section views of vertical charge transfer section.

FIG. 2 is an embodiment of a solid-state imaging device according to the present invention, this showing cross-section views of the photoelectric conversion section in process sequence, and cross-section views of the vertical charge transfer section in the transfer direction in process sequence.

Because the process steps up until the formation of the charge transfer electrode material film 208 on the gate insulation film 207 are the same as the method for manufacturing a solid-state imaging device according to the prior art, shown in FIG. 8 and FIG. 9, these steps have been omitted. The cross-section view of the photoelectric conversion section shows only the aperture portion.

The surface of an n-type semiconductor substrate 201 is thermally oxidized so as to form a gate oxide film 207 thereon. Then, low-pressure CVD is used to deposit a polysilicon charge transfer electrode material film on the gate oxide film 207. Next, photoresist is patterned and a groove-shaped separation (interelectrode gap) region 214 is formed in the charge transfer electrode of the vertical charge transfer section (FIGS. 2(a) and (b)).

Next, a reflow-type insulation film 215 is formed using heat over the entire surface of the device, this being for example BPSG (boron-phosphorus silicate glass). When this is done, the thickness of the BPSG should be approximately twice the thickness of the interelectrode gap dimension (FIG. 2(c)).

Next, thermal processing at 850° C. to 950° C. is done in a nitrogen atmosphere so as to cause reflowing of the insulation film 215, thereby flattening the vertical charge transfer section (FIG. 2(d)).

Next, etching is done of the insulation film 215 until the surface of the charge transfer electrode material film 208 is exposed, so that the insulation film 215 fills in only the interelectrode gap 214. While not shown in the drawings, when this is done, the insulation film is filled in the lead wires regions for application of a drive voltage to the vertical charge transfer section or the separation region between the electrodes of the horizontal charge transfer sections.

After the above, photoresist 209 is patterned on the electrically conductive electrode material film of the photoelectric conversion section. This photoresist 209 is used as a mask to perform dry etching so as to form an aperture 213 in the region 213A of the photoelectric conversion section, which serves also as a reading electrode (FIG. 3(a)).

Next, using the photoresist 209 and the charge transfer electrode 210 as a mask, phosphor is ion implanted, so as to form an n-type well 211 that will serve as the photoelectric conversion section (FIG. 3(b)).

Then, in order to form a buried photodiode, boron is ion implanted, using the photoresist 209 and the charge transfer electrode 210 as a mask, thereby forming a p+-type region 212 (FIG. 3(c)).

Next, the interlayer insulation film 216 is formed (FIG. 3(d)).

Additionally, a metal light-shielding film 217 is formed in the region other than the photoelectric conversion section (FIG. 3(e)).

By performing the above steps, a solid-state imaging device according to the present invention as shown in FIG. 1 is obtained.

In the first embodiment of the present invention, by dividing an etching region when forming a charge transfer electrode, which serves as a charge reading electrode for reading a charge that is generated in a photoelectric conversion section into a first region that provides separation in the row direction and a second region on the photoelectric conversion section, and then, after etching the first region, immediately filling the first region other than the region from which the charge transfer electrode material film has been removed with an insulation film, and the interelectrode gap is flattened, thereby improving the coverage of a metal light-shielding film thereon and metal wiring regions, and enabling the achievement of a wiring structure that enables the application of a high-quality charge transfer pulse. When the above is done, because the photoelectric conversion section is not flattened, it is possible to achieve a complete covering of the side walls of the charge transfer electrode in the photoelectric conversion section by the metal light-shielding film, thereby preventing such effects as intrusion of leaked light and achieving good smear characteristics.

Additionally, after etching of the second region, by performing ion implantation to form an n-type well that serves as photoelectric conversion section, it is possible to achieve a solid-state imaging device with no positioning skew between the photoelectric conversion sections and the charge reading electrodes, this device featuring stable characteristics of reading a signal from the photoelectric conversion section to the vertical charge transfer section.

Because the charge transfer electrode is processed by etching of a single-layer electrically conductive electrode material film, there is no overlap between electrodes, thereby making the interelectrode capacitance small, and eliminating the problem of insulation between electrodes.

Next, the second embodiment of a solid-state imaging device according to the present invention is described below, with reference to relevant drawings.

Figure 10:
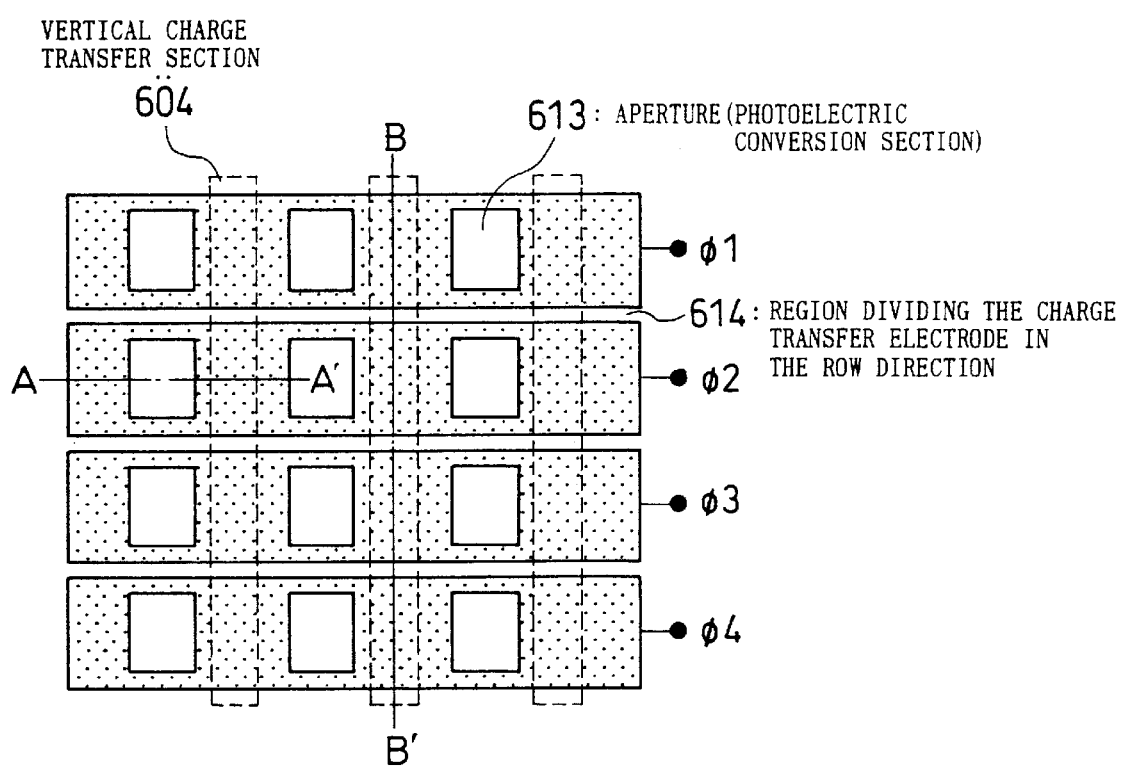
FIG. 10 is a plan view of a solid-state imaging device according to the prior art.
Figure 11:
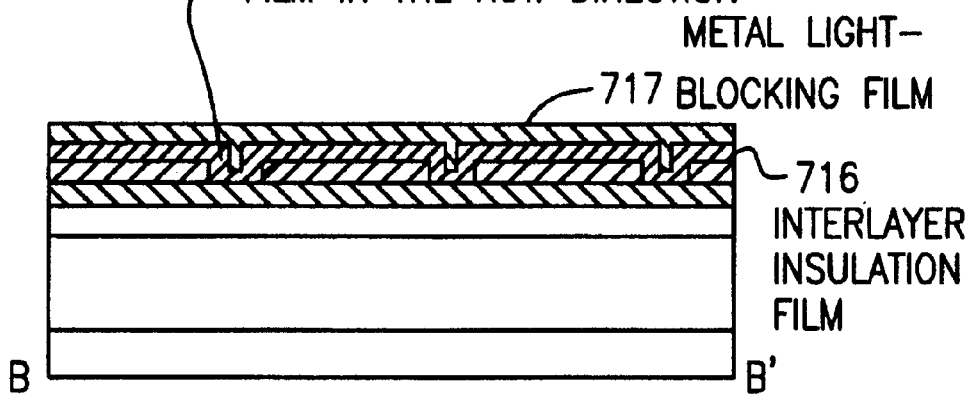
FIG. 11 is a cross-section view showing the charge transfer electrode of a solid-state imaging device according to the prior art.
Figure 12:
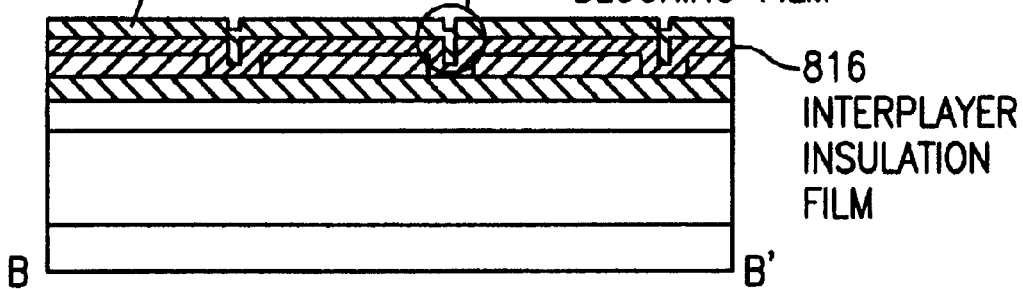
FIG. 12 is a cross-section view showing the problems with a solid-state imaging device according to the prior art.
Figure 13:
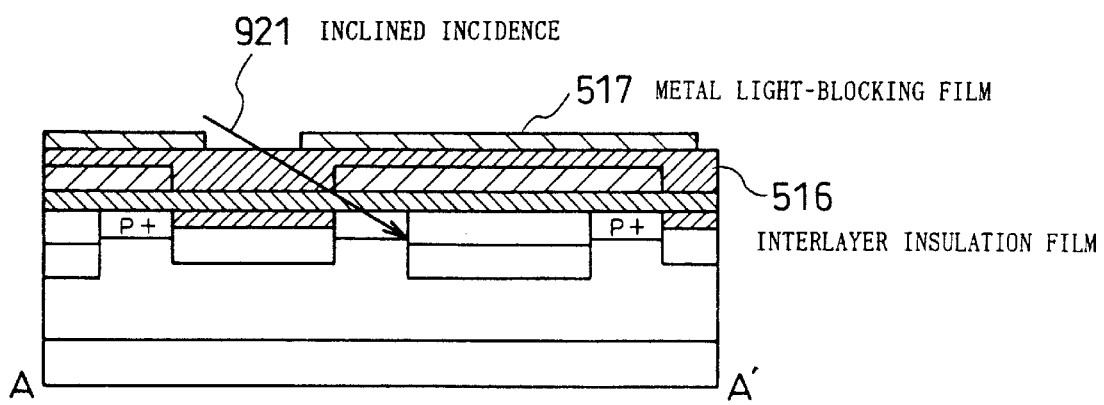
FIG. 13 is a cross-section view showing the problems with a solid-state imaging device according to the prior art.

FIG. 4 shows the second embodiment, in which, because the plan view pattern is the same as shown in FIG. 10, the plan view pattern is not illustrated. FIG. 4(a) shows a cross-section view of the photoelectric conversion section (corresponding to the A–A' cross-section view of FIG. 10), and FIG. 4(b) is a cross-section view along the transfer direction of the vertical charge transfer section (corresponding to the B–B' cross-section view of FIG. 10).

In this embodiment, a charge transfer electrode is formed by polysilicon, and a well-shaped region that separates the charge transfer electrode in the row direction is filled with an insulation film 315, so as to achieve flatness, after which are formed an interlayer insulation film 316 and a metal light-shielding film 317.

A difference in this embodiment with respect to the first embodiment is the siliciding of the surface of the charge transfer electrode, so as to reduce the electrode resistance.

In the second embodiment as well, etching process is divided into two steps. The first step is an etching of the regions that separate the charge transfer electrode in the row direction, and second step is an etching of the photoelectric conversion section. After the etching of the photoelectric conversion section, ion implantation of phosphor is done so as to form an n-type well that will serve as the photoelectric conversion section, thereby forming the charge reading electrode and the photoelectric conversion section in a self-aligning manner.

The method for manufacturing the solid-state imaging device shown in FIG. 4 is described below, making reference to cross-section views of the photoelectric conversion section and cross-section views along the transfer direction of the vertical charge transfer section.

Figure 5:
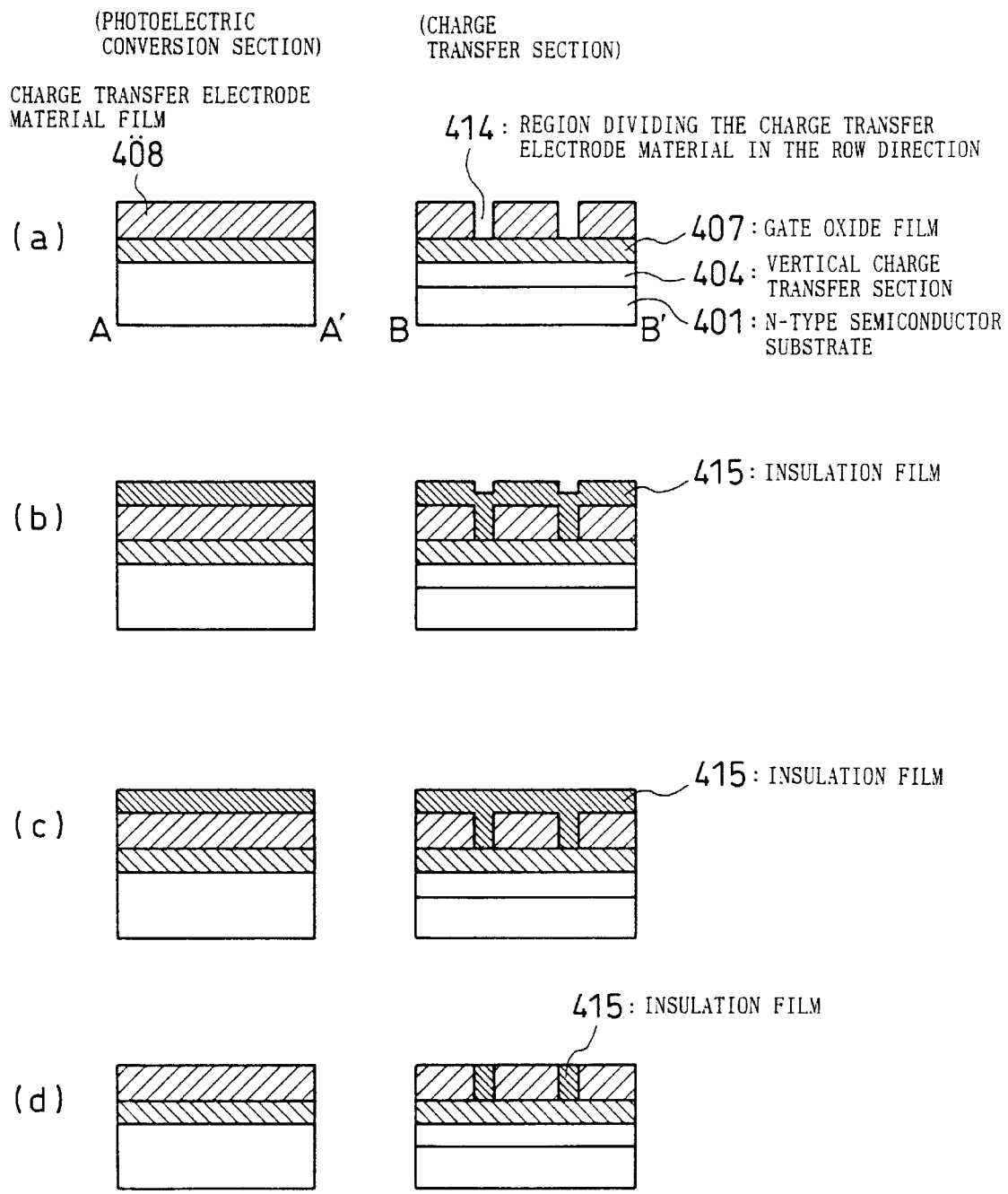
FIG. 5(a) is a cross-section view showing the processes for manufacturing the second embodiment of a solid-state imaging device according to the present invention.
FIG. 5(b) is a cross-section view showing processes subsequent to those shown in FIG. 5(a).
FIG. 5(c) is a cross-section view showing processes subsequent to those shown in FIG. 5(b).
FIG. 5(d) is a cross-section view showing processes subsequent to those shown in FIG. 5(c).
Figure 6:
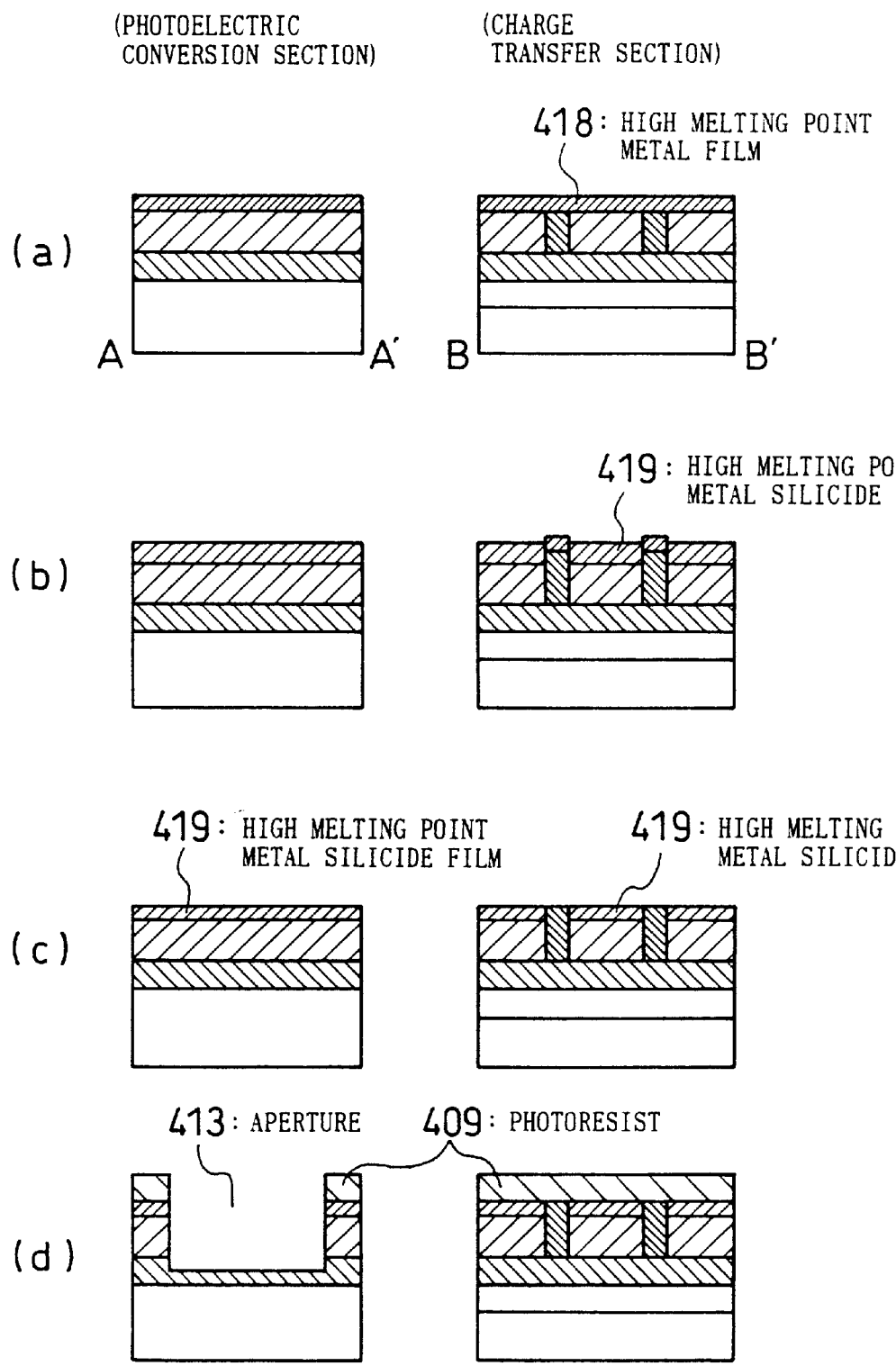
FIG. 6(a) is a cross-section view showing processes subsequent to those shown in FIG. 5(d).
FIG. 6(b) is a cross-section view showing processes subsequent to those shown in FIG. 6(a).
FIG. 6(c) is a cross-section view showing processes subsequent to those shown in FIG. 6(b).
FIG. 6(d) is a cross-section view showing processes subsequent to those shown in FIG. 6(c).
Figure 7:
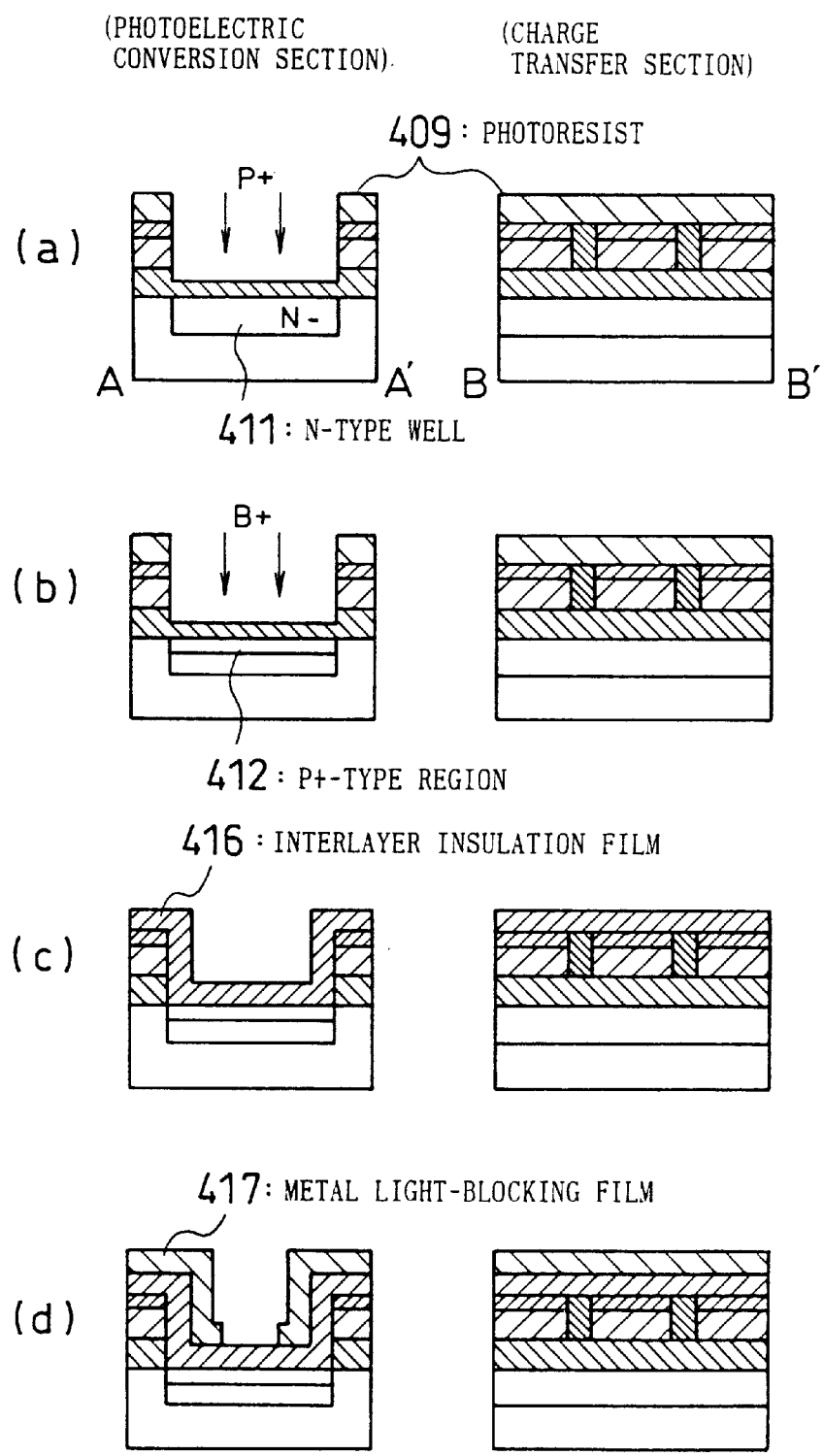
FIG. 7(a) is a cross-section view showing processes subsequent to those shown in FIG. 6(d).
FIG. 7(b) is a cross-section view showing processes subsequent to those shown in FIG. 7(a).
FIG. 7(c) is a cross-section view showing processes subsequent to those shown in FIG. 7(b).
FIG. 7(d) is a cross-section view showing processes subsequent to those shown in FIG. 7(c).

FIG. 5 to FIG. 7 show cross-section views of the photoelectric conversion section and the vertical charge transfer section along the transfer direction in process step sequence.

Because the process steps up until the formation of the charge transfer electrode material film 408 on the gate oxide film 407 are the same as the method for manufacturing a solid-state imaging device according to the prior art, shown in FIG. 8, these steps have been omitted. The cross-section view of the photoelectric conversion section shows only the aperture portion.

The surface of an n-type semiconductor substrate 401 is thermally oxidized to form a gate oxide film 407 thereon.

Then, low-pressure CVD is used to deposit a polysilicon charge transfer electrode material film 408 on the gate oxide film 407. Next, a groove-shaped separation (interelectrode gap) region 414 is formed in the charge transfer electrode of the vertical charge transfer section (FIG. 5(a)).

Next, a reflow-type insulation film 415 is formed using heat over the entire surface, this being for example a BPSG. When this is done, the thickness of the BPSG should be approximately twice the thickness of the interelectrode gap dimension (FIG. 5(b)).

Next, thermal processing at 850° C. to 950° C. is done in a nitrogen atmosphere so as to cause reflowing of the insulation film 415, thereby flattening the vertical charge transfer section (FIG. 5(c)).

Next, etching is done of the insulation film 415 until the surface of the charge transfer electrode material film 408 is exposed, so that the insulation film 215 fills in only the interelectrode gap 414.

While not shown in the drawings, when this is done, the insulation film 415 is filled in the lead wires regions for application of a drive voltage to the vertical charge transfer section and the separation region between the electrodes of the horizontal charge transfer sections (FIG. 5(d)).

Next, a metal film or silicide thereof, such as a titanium film 418, is formed as a cover over the entire surface of the device (FIG. 6(a)).

Next, heat treating is done at 700° C. in a nitrogen atmosphere, thereby causing a reaction between the titanium an the polysilicon of the charge transfer electrode material film 408, thereby forming titanium silicide on the surface of the polysilicon. When this is done, no siliciding is done on the part of the surface that is not exposed, for example on the insulation film of the interelectrode gap (FIG. 6(b)) Next, unreacted titanium is removed by etching (FIG. 6(d)).

Then, photoresist 409 is patterned on the electrically conductive electrode material film of the photoelectric conversion section. This photoresist 409 is used as a mask to perform dry etching, thereby forming the aperture in a region on the photoelectric conversion section (FIG. 6(d)).

Next, using the photoresist 409 and the charge transfer electrode 410 as a mask, phosphor is ion implanted so as to form an n-type well 411 which will serve as the photoelectric conversion section (FIG. 7(a)).

Thereafter, in order to form a buried photodiode, boron is ion implanted using the photoresist 409 and the charge transfer electrode 410 as a mask, thereby forming a p+ type region 412 (FIG. 7(b)).

Next, the interlayer insulation film 416 is formed (FIG. 7(c)), and a metal light-shielding film 417 is formed in the region other than the photoelectric conversion section (FIG. 7(d)).

By performing the above steps, a solid-state imaging device of the second embodiment of the present invention as shown in FIG. 4 is obtained.

In the second embodiment of the present invention, in addition to achieving the advantages described with regard to the first embodiment, because it is possible to reduce the charge transfer electrode resistance, there is the advantage of being able to obtain charge transfer characteristics with a sharp charge transfer pulse having little sag. Additionally, because the silicide film formed on the surface of the charge transfer electrode has low transparency to light, there is effective blocking of light piercing through the light-shielding film or entering the aperture at an inclination, thereby achieving good smear characteristics and high reliability.

In implementing the present invention, it is preferable to control the angle of incidence of ion implantation of the second conductivity type dopant, so as to form a second conductivity region 111a so as to encroach under the charge transfer electrode 110, this being formed in a self-aligning manner as shown in FIG. 1(a).

Additionally, it is preferable in the present invention that the angle of incidence of ion implantation of a first conductivity type dopant is controlled, so to form a first conductivity type semiconductor layer 112 in a self-aligning manner and at a prescribed distance D to an edge of the charge transfer electrode 110 as shown in FIG. 1(a).

As described in detail above, in the method of manufacturing a solid-state imaging device according to the present invention, by dividing the etching region into a first region to be divided in the row direction and a second region on a photoelectric conversion section, the etching region of the first region being filled with an insulation film, so as to flatten only the top portion of the vertical charge transfer section or the bottom portion of a wiring region for applying a drive voltage to a charge transfer electrode, thereby achieving a solid-state imaging device with good formation of metal wiring, without a deterioration of the smear characteristics.

What is claimed is:

1. A solid-state imaging device comprising:
   a photoelectric conversion section formed on a substrate;
   a charge transfer section formed adjacent to said photoelectric conversion section said charge transfer section receives and transfers a signal charge generated by said photoelectric conversion section;
   a read-out section formed on said substrate, said read-out section reads said signal charge generated by said photoelectric conversion section to said charge transfer section;
   a gate oxide film formed over said read-out section and said charge transfer section;
   a plurality of charge transfer electrodes formed on said gate oxide film, and having spaces formed therebetween;
   a first insulation film overlying said gate oxide film and filling said spaces between said plurality of charge transfer electrodes;

a second insulation film overlying said first insulation film and said plurality of charge transfer electrodes, said second insulation film having a flat top surface; and a metal film overlying said second insulation film.

2. A solid state imaging device comprising:

a structure for use with a solid state imaging device; and a plurality of charge transfer electrodes formed over a gate oxide film, wherein a space is formed between each of said plurality of charge transfer electrodes exposing said gate oxide film;

a first insulation film overlying said gate oxide film and filling said space;

a second insulation film overlying said first insulation film and said plurality of charge transfer electrodes, said second insulation film having a flat top surface; and a metal film overlying said second insulation film.

3. A solid state imaging device comprising:

a structure for use with a solid state imaging device; and a plurality of charge transfer electrodes formed over a gate oxide film, wherein a space is formed in portions not covered by said plurality of charge transfer electrodes over said gate oxide film;

a first insulation film overlying said gate oxide film and filling said space having a top surface substantially flush with said charge transfer electrode;

a second insulation film overlying said first insulation film and said plurality of charge transfer electrodes, said second insulation film having a flat top surface; and a metal film overlying said second insulation film.

* * * * *